United States Patent
Chu et al.

(10) Patent No.: US 7,773,278 B2
(45) Date of Patent: Aug. 10, 2010

(54) REFLECTIVE OPTICAL SCANNING SYSTEM HAVING MINIMIZED ABERRATION

(75) Inventors: Shi-Wei Chu, Taipei (TW); Jiun-Yann Yu, Taipei (TW)

(73) Assignee: National Taiwan University, Taipei (TW)

(*) Notice: Subject to any disclaimer, the term of this patent is extended or adjusted under 35 U.S.C. 154(b) by 0 days.

(21) Appl. No.: 12/483,026

(22) Filed: Jun. 11, 2009

(65) Prior Publication Data
US 2010/0118365 A1    May 13, 2010

(30) Foreign Application Priority Data
Nov. 13, 2008   (TW) .............................. 97143848 A

(51) Int. Cl.
*G02B 26/08*    (2006.01)

(52) U.S. Cl. ................................. 359/202.1; 359/208.1
(58) Field of Classification Search .............. 359/201.2, 359/208.1, 730
See application file for complete search history.

(56) References Cited

U.S. PATENT DOCUMENTS 5,168,386 A * 12/1992 Galbraith .................. 359/215.1
6,134,002 A * 10/2000 Stimson et al. ............. 356/326

* cited by examiner

*Primary Examiner*—James Phan
(74) *Attorney, Agent, or Firm*—Jackson IPG PLLC

(57) ABSTRACT

The present invention is a scanning system having spherical mirrors to operate a two-dimensional scanning. Aberration owing to oblique incident light is compensated to reach diffraction limit. With proper metallic coating, the present invention uses a wavelength from ultra-violet light to terahertz wavelength 10 Claims, 12 Drawing Sheets

REFLECTIVE OPTICAL SCANNING SYSTEM HAVING MINIMIZED ABERRATION

FIELD OF THE INVENTION

The present invention relates to a scanning system; more particularly, relates to a reflective optical scanning system compensating for coma and astigmatism.

DESCRIPTION OF THE RELATED ARTS

Optical scanning system is widely used in optical lithography, like laser scanning microscope, laser scanning ophthalmoscopy, laser-based precision manufacture and semiconductor processing. Except those used in laser scanning ophthalmoscopy, most optical scanning system uses lenses with scanning mirrors for two-dimensional (2D) scanning, as revealed in US patent No. 2007/0253057 A1 and U.S. Pat. No. 6,108,127. However, optical absorption of lens material and chromatic aberration from material dispersion become major issues. Through supercontinuum and optical parametric oscillation, light sources covering wavelengths from ultraviolet to tera-hertz are available. An imaging system capable of molecular identification can be realized by using optical scanning systems with the above light sources. Yet, no lens material allows light sources having so wide frequency range of wavelengths for passing. Even some wavelengths pass, material dispersion results in chromatic aberration, which makes the systems not ready for broadband applications. Consequently, reflective mirrors should be adopted with scanning mirrors for constructing scanning systems.

Some scanning systems using reflective mirrors are revealed in U.S. Pat. Nos. 6,337,920 B1, 5,071,246 and 5,815,242, which are mainly used in ophthalmoscopy. If lenses are used in laser scanning ophthalmoscopy light is normally incident on the lenses and surface-reflected light is generated as background noise. On the other hand, if reflective mirror is used, light is obliquely incident and no background noise is formed. Nevertheless, a scanning system using reflective mirrors faces geometric aberrations such as coma and astigmatism due to oblique incidence As revealed in U.S. Pat. No. 6,099,127, a special scanning system using reflective mirrors minimizes chromatic aberration. However, it is a laser scanning system for ophthalmoscopy, which uses only wavelengths among visible to near-infrared range and does not take advantage in an ultra broadband reflection spectrum of a metal-coated mirror.

A scanning optical path design using reflective mirror, as revealed in US patent No. 2007/0046948, is shown in FIG. 7. When a laser beam 4 shines on a horizontal scanning (HS) mirror 41, the HS mirror 41 turns left and right for horizontal scanning. A first spherical mirror 51 and a second spherical mirror 52 located downstream along the optical path are used to converge the scanning laser beam 4 onto a vertical scanning (VS) mirror 42 by turning up and down. A third spherical mirror 53 and a fourth spherical mirror 54 located downstream along the optical path converges the laser beam 4 again onto an eye 6 where a 2D image is thus formed on a retina. On the other hand, if the eye is changed into a microscope objective, a 2D scanning pattern at the focal plane of the objective is formed, which basically functions as a laser scanning microscope.

Nevertheless, spherical mirrors are positioned at the same height in normal designs and aberration is thus not avoidable owing to the obliquely incident light. In FIG. 8, a laser beam 4a is introduced through a scanning mirror. The system has a first and a second spherical mirrors 51a, 52a having the same focal lengths; and an ideal lens 5. Through analyzing characteristics of the optical beam around the lens focus by the ZEMAX software, FIG. 9 and FIG. 10 are obtained showing changes in focal spots before and after the focal points. Since all spherical mirrors reflect the optical beam upwardly, the geometrical aberrations accumulate along the optical path. Coma at the focal point is shown in FIG. 9 and astigmatism around the focus is shown in FIG. 10, respectively. It is obvious that the focal spots before and after the focal point are oval-shaped; and the original horizontal ellipse before the focal point is changed into the vertical ellipse after the focal point, which manifests the existence of astigmatism.

To sum up, general laser scanning system uses lenses and wavelength range is thus limited by the transmission of the lens material. If spherical mirrors are used instead to expand the applicable bandwidth, geometric aberrations are encountered due to oblique incidence. Hence, the prior arts do not fulfill all users' requests on actual use.

SUMMARY OF THE INVENTION

The main purpose of the present invention is to provide a reflective optical scanning system compensating for coma and astigmatism.

The second purpose of the present invention is to use a beam having a wavelength ranged from an ultra-violet light to a wavelength having tera-hertz; and to reach diffraction limit with minimized aberration by specific locations of mirrors.

The third purpose of the present invention is to adjust a diameter of inlet light and a diameter of outlet light by properly positioning scanning mirrors and spherical mirrors coordinated with different focal distances of the spherical mirrors; and to further reach a diffraction limit with a wavefront irregularity root-mean-value smaller than $1/14$ wavelength of an optical beam.

The fourth purpose of the present invention is to apply the present invention in fields of laser micrometry, laser-related technologies, high-power laser machining and semiconductor processing.

To achieve the above purposes the present invention is a reflective optical scanning system having minimized aberration, comprising a first scanning mirror receiving an optical beam to process a horizontal scanning by turning left and right; a first spherical mirror converging and reflecting the optical beam scattered by the first scanning mirror while the first spherical mirror is located downstream of an optical path of the first scanning mirror at a distance equal to a focal distance of the first spherical mirror; a second spherical mirror reflecting the optical beam reflected by the first spherical mirror while the second spherical mirror is located downstream of an optical path of the first spherical mirror at a distance equal to a sum of the focal distance of the first spherical mirror and a focal distance of the second spherical mirror; a second scanning mirror reflecting the optical beam converged by the second spherical mirror to processing a vertical scanning by turning up and down while the second scanning mirror is located downstream of an optical path of the second spherical mirror at a distance equal to a focal distance of the second spherical mirror; a third spherical mirror converging and reflecting the optical beam scattered by the second scanning mirror while the third spherical mirror is located downstream of an optical path of the second scanning mirror at a distance equal to a focal distance of the third spherical mirror; and a fourth spherical mirror reflecting the optical beam reflected by the third spherical mirror while the fourth spherical mirror is located downstream of an optical path of the third spherical mirror at a distance equal to a sum of the focal distance of the third spherical mirror and a focal distance of the fourth spherical mirror, where a set of the first spherical mirror and the second spherical mirror together with a set of the third spherical mirror and the fourth spherical mirror compensate for astigmatism by coinciding a sagittal axle of the first spherical mirror and the third spherical mirror with a tangential axle of the second spherical mirror and the fourth spherical mirror; and a set of the first spherical mirror and the third spherical mirror together with a set of the second spherical mirror and the fourth spherical mirror compensate for coma by turning the first spherical mirror and third spherical mirror to X and −X direction while turning the second spherical mirror and the fourth spherical mirror to Y and −Y direction. Accordingly, a novel reflective optical scanning system having minimized aberration is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1A:
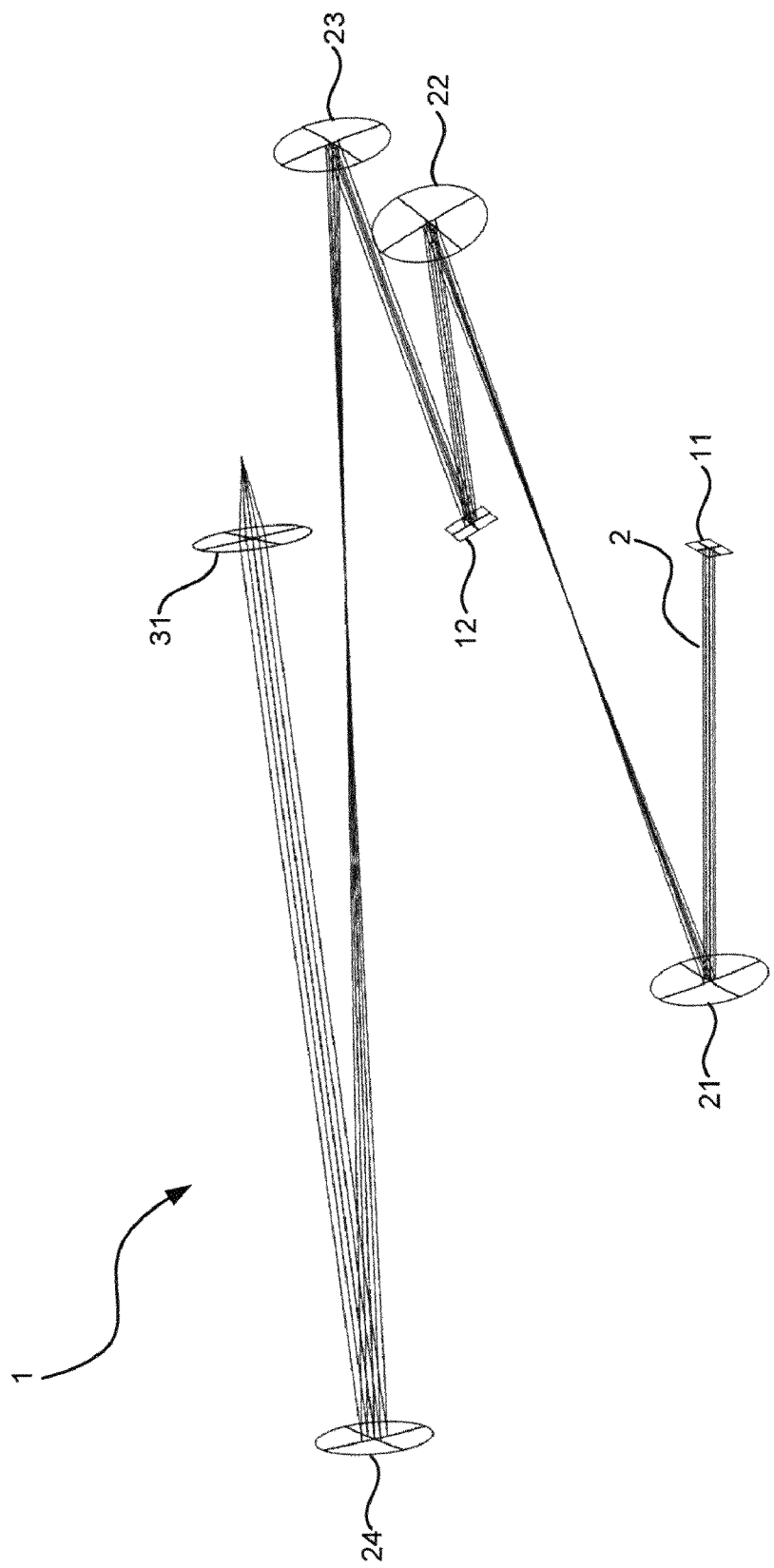
FIG. 1A to FIG. 1C are the perspective view, the top view and the side view showing the preferred embodiment according to the present invention.
Figure 1B:
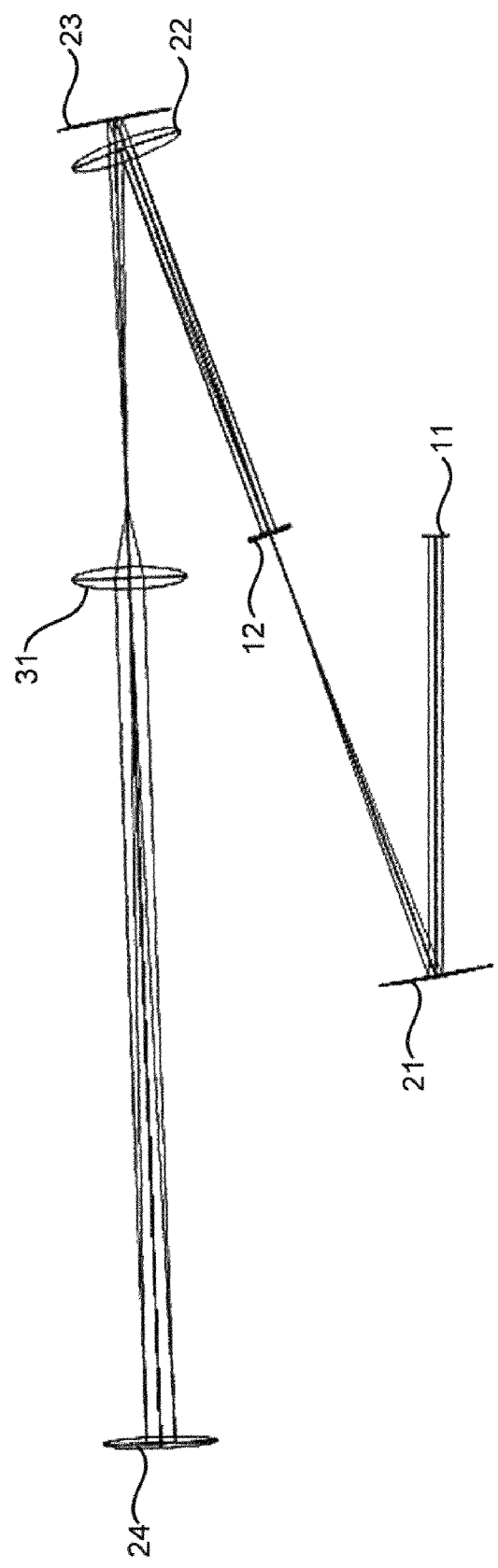
Figure 1C:
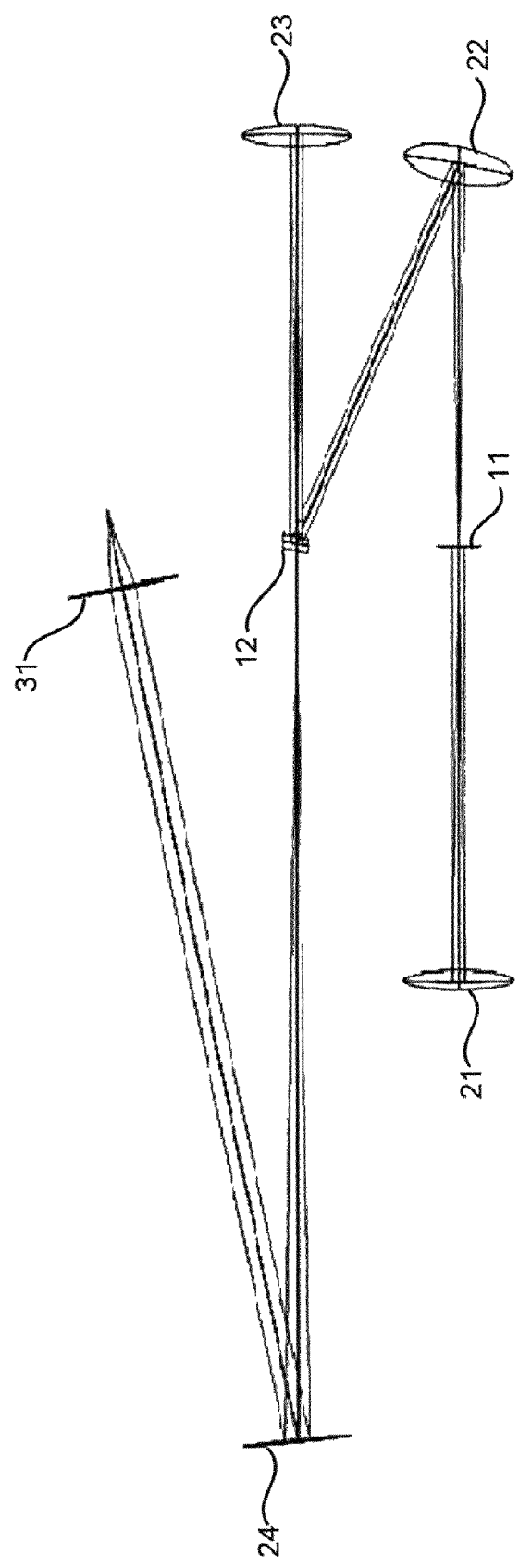

Please refer to FIG. 1A to FIG. 1C which are a perspective view, a top view and a side view showing a preferred embodiment according to the present invention. As shown in the figure, the present invention is a reflective optical scanning system 1 having minimized aberration, comprising a first scanning mirror 11, a first spherical mirror 21 a second spherical mirror 22, a second scanning mirror 12 a third spherical mirror 23 and a fourth spherical mirror 24, where an optical beam 2 having a wavelength ranged from ultra-violet light to a wavelength having tera-hertz is used as a light source for a 2D scanning with aberration minimized.

The first scanning mirror 11 is a horizontal scanning (HS) mirror, where the optical beam 2 is inlet for horizontal scanning by turning the first scanning mirror 11 left and right.

The first spherical mirror 21 is located downstream of an optical path of the first scanning mirror 11 and has a distance to the first scanning mirror 11 equal to a focal distance of the first spherical mirror 21, where the first spherical mirror 21 converges and reflects the optical beam 2 scattered by the first scanning mirror 11.

The second spherical mirror 22 is located downstream of an optical path of the first spherical mirror 21 and has a distance to the first spherical mirror 21 equal to a sum of the focal distance of the first spherical mirror 21 and a focal distance of the second spherical mirror 22, where the second spherical mirror 22 reflects the optical beam 2 reflected by the first spherical mirror 21.

The second scanning mirror 12 is a vertical scanning (VS) mirror located downstream of an optical path of the second spherical mirror 22 and has a distance to the second spherical mirror 22 equal to the focal distance of the second spherical mirror 22, where the second scanning mirror 12 reflects the optical beam 2 converged by the second spherical mirror 22 for vertical scanning by turning the second scanning mirror 12 up and down.

The third spherical mirror 23 is located downstream of an optical path of the second scanning mirror 12 and has a distance to the second scanning mirror 12 equal to a focal distance of the third spherical mirror 23, where the third spherical mirror 23 converges and reflects the optical beam 2 scattered by the second scanning mirror 12.

The fourth spherical mirror 24 is located downstream of an optical path of the third spherical mirror 23 and has a distance to the third spherical mirror 23 equal to a sum of the focal distance of the third spherical mirror 23 and a focal distance of the fourth spherical mirror 24 where the fourth spherical mirror 24 reflects the optical beam 2 reflected by the third spherical mirror 23.

An ideal lens 31 is further located downstream of an optical path of the fourth spherical mirror 24 and has a distance to the fourth spherical mirror 24 equal to a focal distance of the fourth spherical mirror 24, where the ideal lens 31 converges the optical beam 2 reflected by the fourth spherical mirror 24 for further analyzing optical characteristics.

Therein, the first and second mirrors 11, 12 are both a plane mirror or a polygon mirror turning in a galvanometric way or a resonant way; each of the first to the fourth spherical mirrors 21~24 is coated with a film of gold, silver or aluminum; and the reflective optical scanning system 1 may further comprise a plurality of plane mirrors to fold optical paths into a size of 15×15×15 cubic centimeters. Thus, a novel reflective optical scanning system 1 having minimized aberration is obtained.

On using the present invention, a sagittal axle of the first and the third spherical mirrors 21, 23 coincides with a tangential axle of the second and the fourth spherical mirrors 22, 24, so that a set of the first and the second spherical mirrors 21, 22 together with a set of the third and the fourth spherical mirrors 23, 24 compensate for astigmatism. The first and the third spherical mirrors 21, 23 turn to X and −X direction while the second and the fourth spherical mirrors 22, 24 turn to Y and −Y direction, so that a set of the first and the third spherical mirrors 21, 23 together with a set of the second and the fourth spherical mirrors 22, 24 compensate for coma. Thus, a scanning optical path is reflected by the HS mirror—the first scanning mirror 11; then is reflected by the first and the second spherical mirrors 21, 22 to reach the VS mirror—the second scanning mirror 12; and then is reflected by the third and the fourth spherical mirrors 23, 24 to reach the ideal lens 31.

Figure 2:
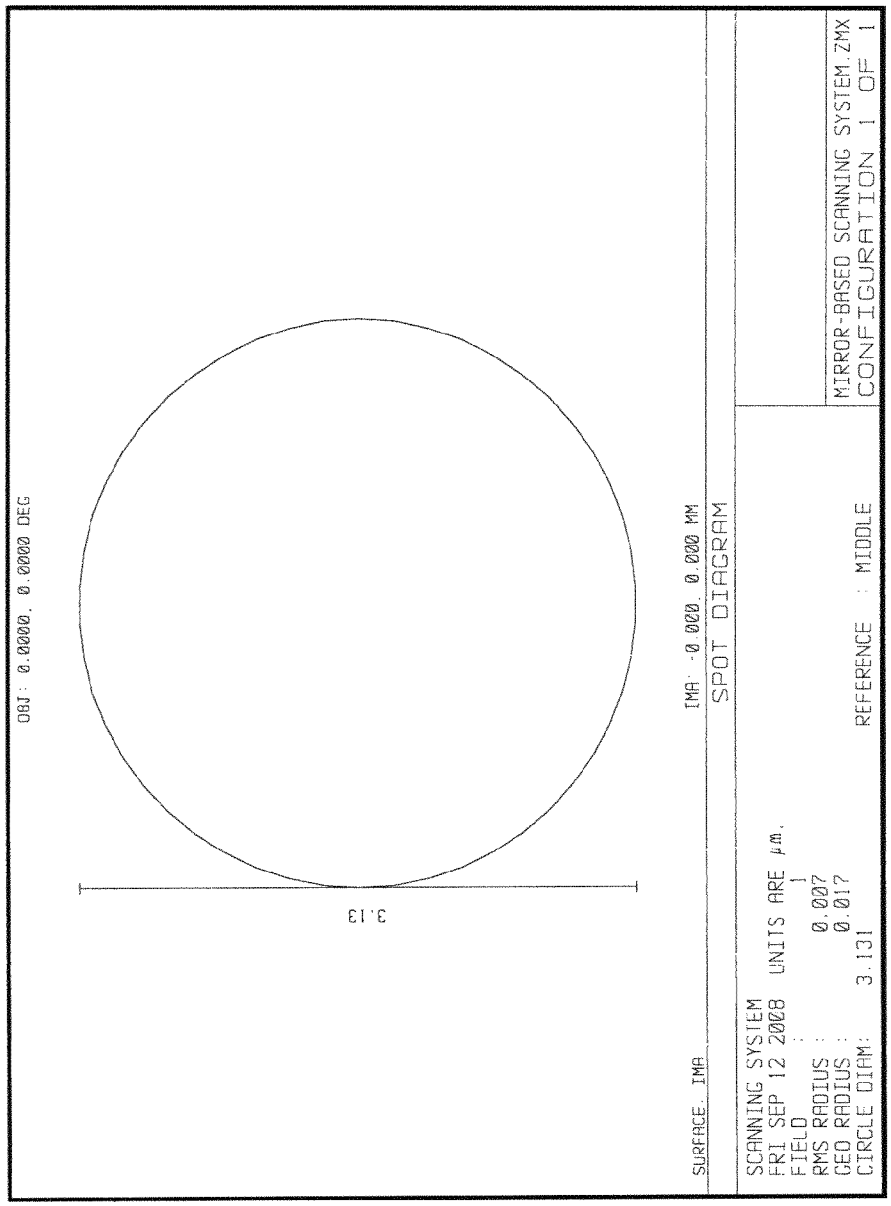
FIG. 2 is the view showing the diameter of the center focal spot of the scanning optical path.
Figure 3:
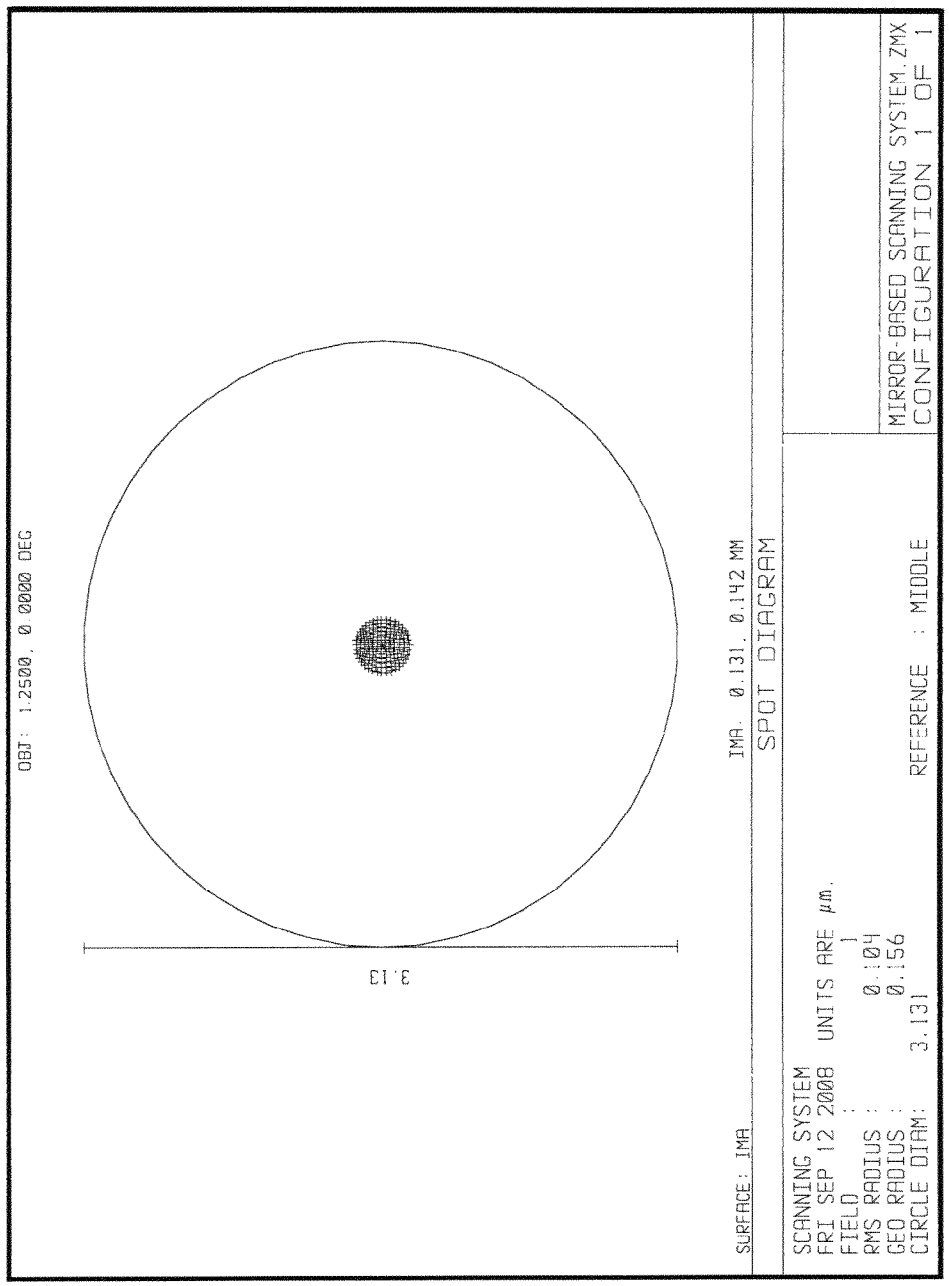
FIG. 3 is the view showing the diameter of the down-right focal spot of the scanning optical path.
Figure 4:
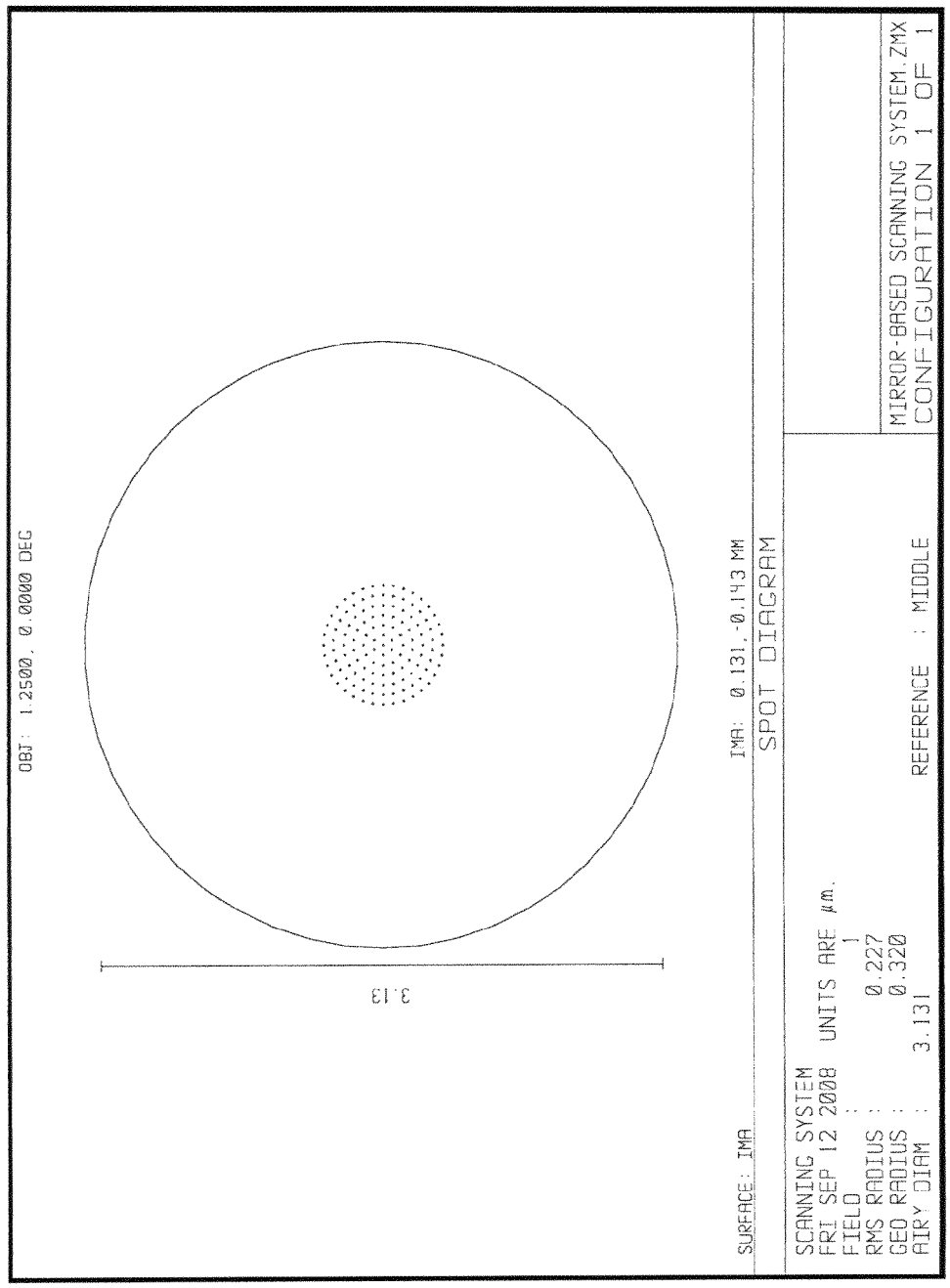
FIG. 4 is the view showing the diameter of the down-left focal spot of the scanning optical path.

Please refer to FIG. 2 to FIG. 4, which are views showing diameters of center, down-right and down-left focal spots of a scanning optical path. As shown in the figures, an area of 1°×1° is scanned with a focal spot at center, a focal spot at down-right and a focal spot at down-left. A circle around the center focal spot shown in FIG. 2 indicates a theoretical diffraction limit. In FIG. 2 to FIG. 4, all focal spots show that an optical path design of the present invention fits the diffraction limit.

Figure 5:
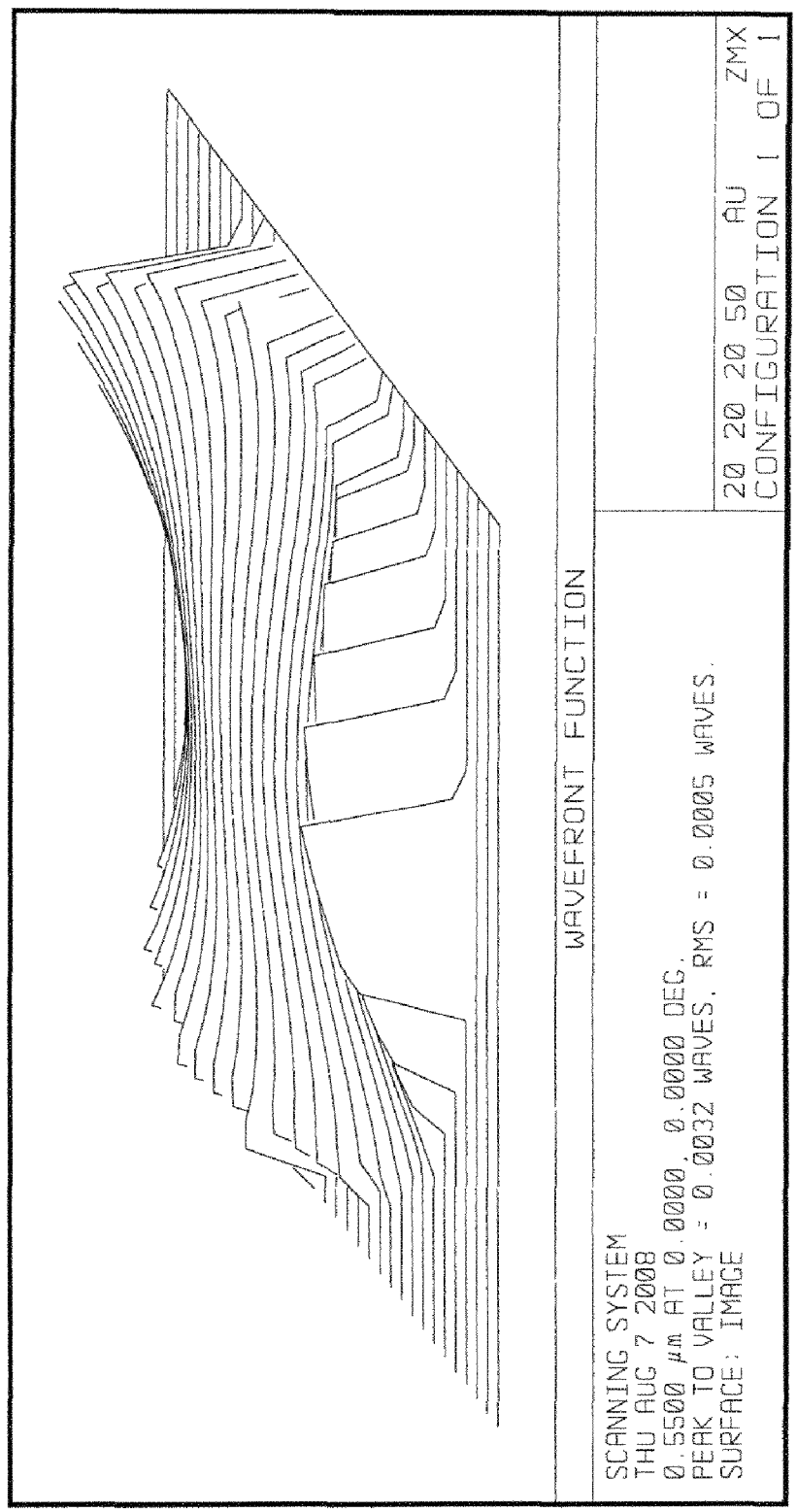
FIG. 5 is the view showing the wavefront regularity of the center focal spot of the scanning optical path.
Figure 6:
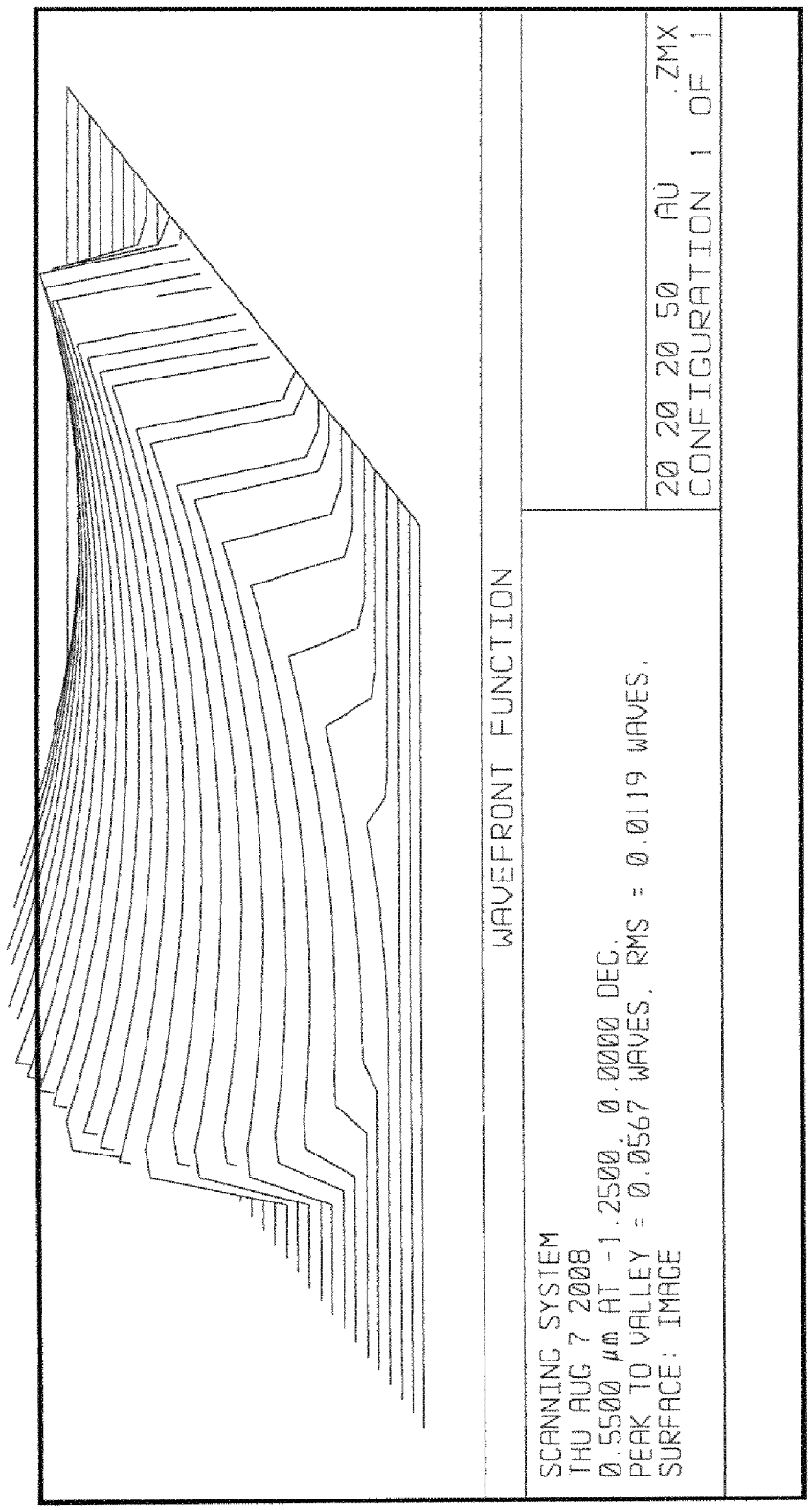
FIG. 6 is the view showing the wavefront regularity of the down-right focal spot of the scanning optical path.
Figure 7:
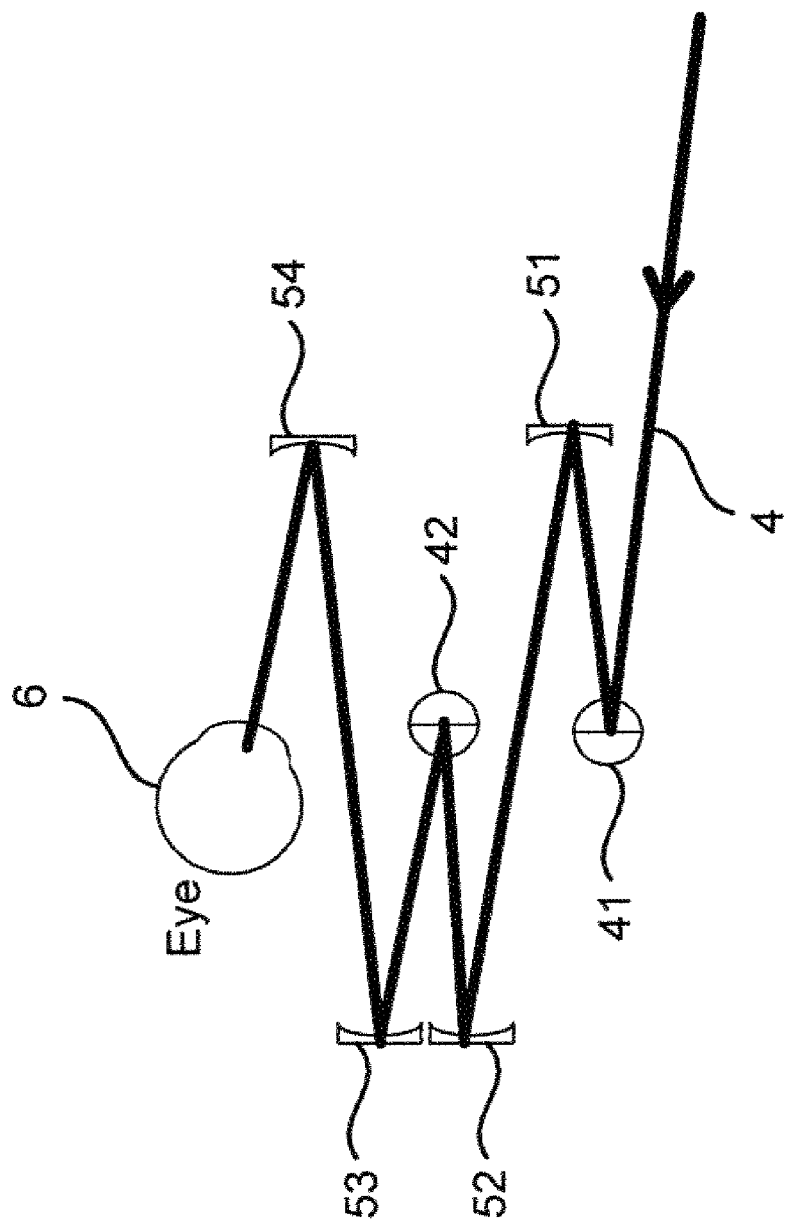
FIG. 7 is the view of the first prior art.
Figure 8:
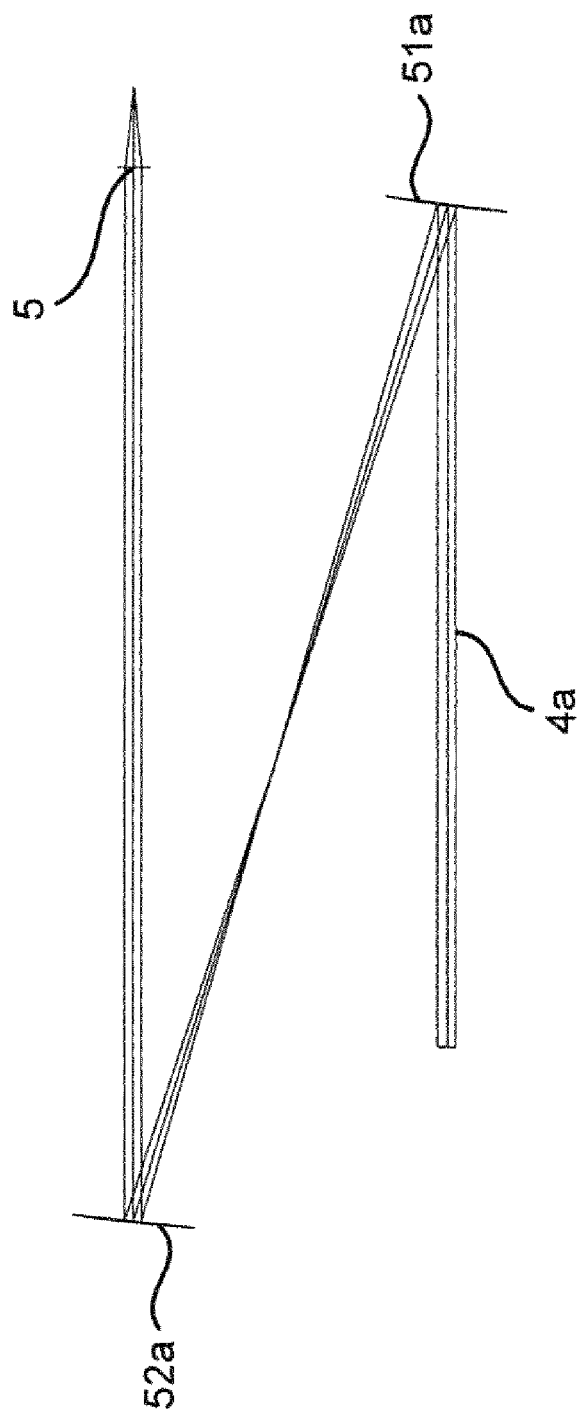
FIG. 8 is the view of the second prior art.
Figure 9:
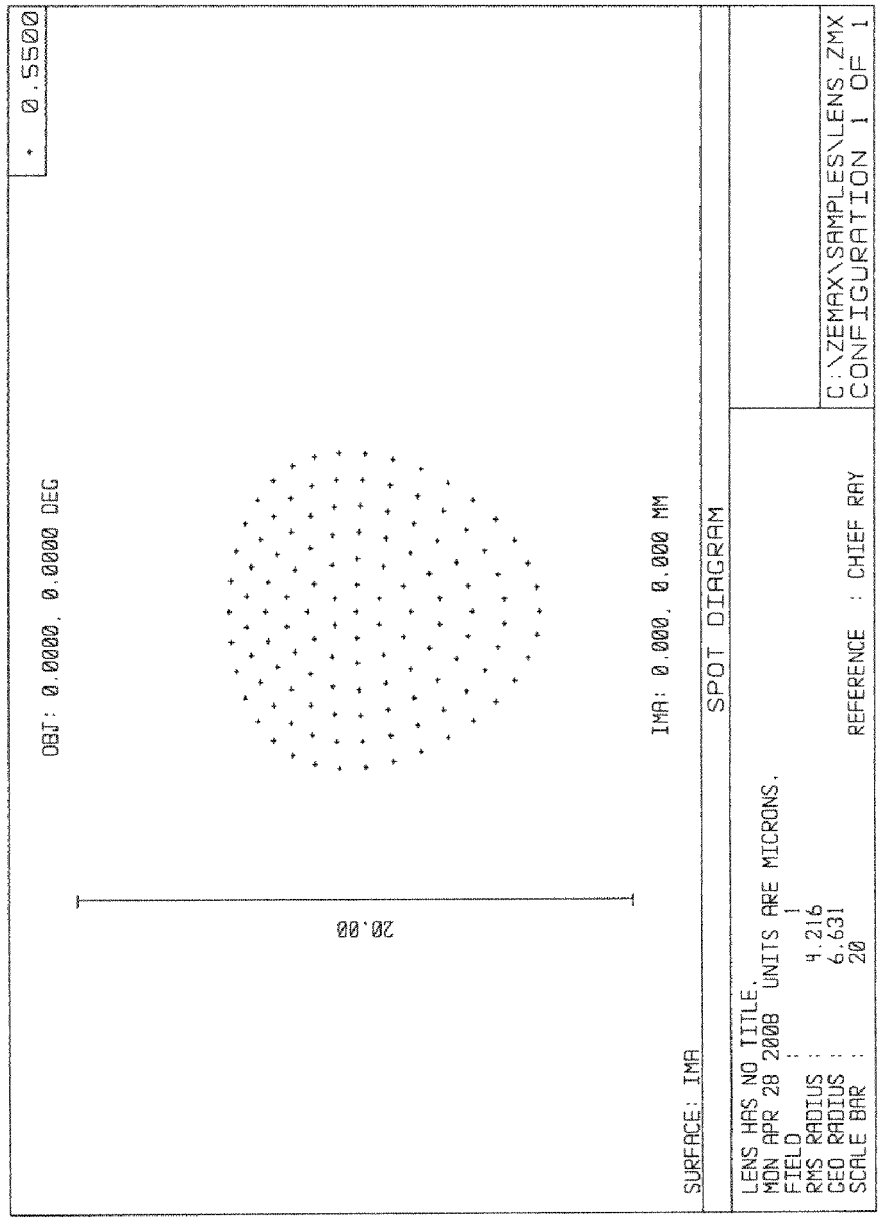
FIG. 9 and FIG. 10 are the views of the coma and the astigmatism at the focal point of the optical path in FIG. 8.
Figure 10:
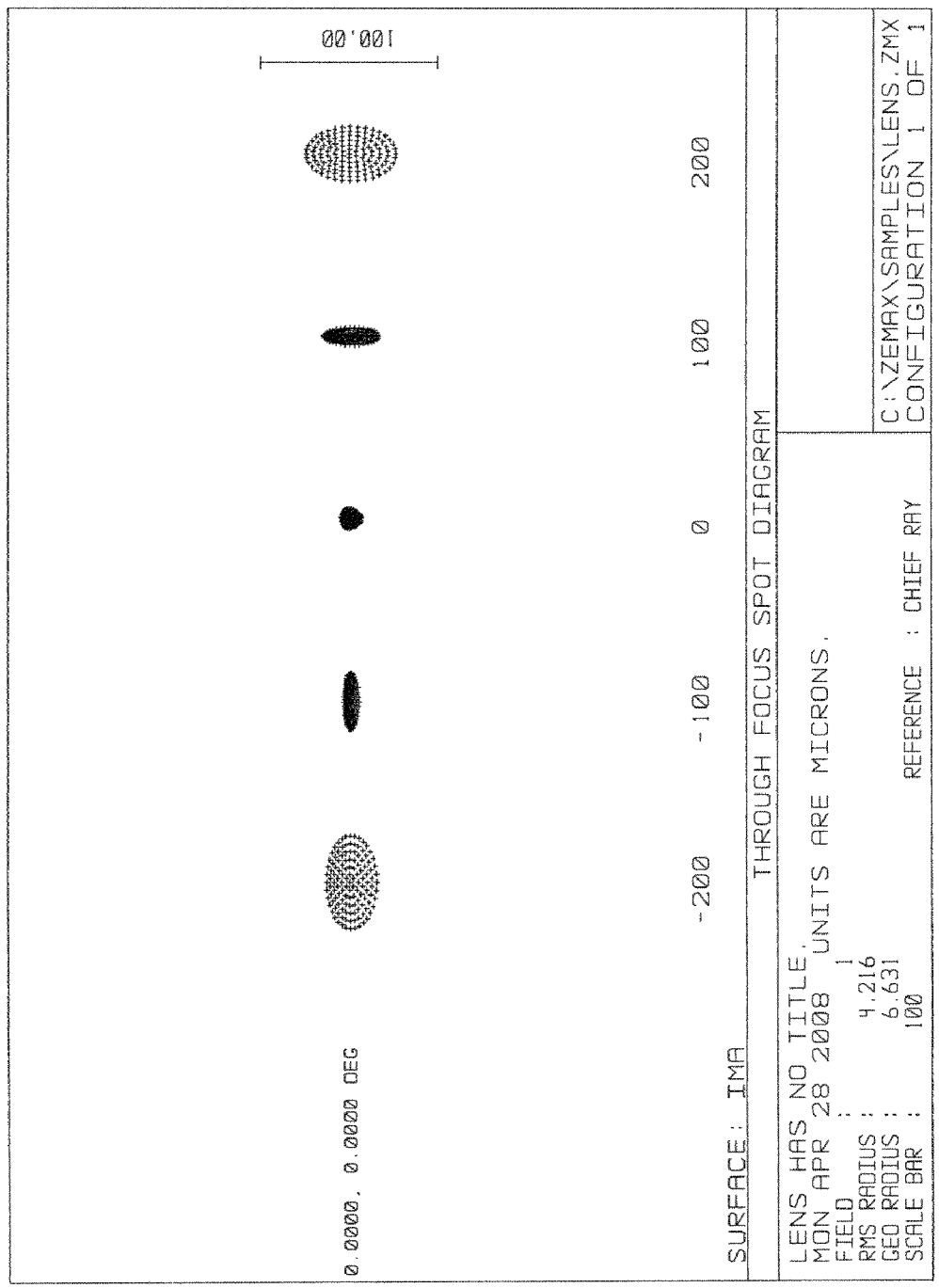

Please refer to FIG. 5 and FIG. 6, which are views showing wavefront regularities of a center and a down-right focal spots of a scanning optical path. As shown in the figures, wavefront irregularity root-mean-values smaller than $\frac{1}{14}$ wavelength of an optical beam obtained with the present invention indicate capability for reaching diffraction limit according to Marechal criterion. In FIG. 5 and FIG. 6, the wavefront irregularity root-mean-values are 0.0005 and 0.0119 wavelength, which fit Marechal criterion for reaching diffraction limit.

Thus, the present invention compensates for aberration to reach diffraction limit. Through coating a metal like gold, silver or aluminum, a wavelength range of the reflective optical scanning system covers from ultra-violet light to a wavelength having tera-hertz, where the optical scanning system uses rapid-turning scanning mirrors for reaching a speed up to scanning tens even hundreds of images. Hence, applications of the present invention cover fields of laser micrometry, laser-related technologies, high-power laser machining and semiconductor processing.

To sum up, the present invention is a reflective optical scanning system having minimized aberration, where a diameter of inlet light and a diameter of outlet light are adjusted by properly positioning scanning mirrors and spherical mirrors coordinated with different focal distances of spherical mirrors; a wavefront irregularity is minimized for reaching diffraction limit; and inlet aberration is minimized with the specific locations of the mirrors.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A reflective optical scanning system having minimized aberration, comprising:
   a first scanning mirror, said first scanning mirror receiving an optical beam to process a horizontal scanning (HS);
   a first spherical mirror said first spherical mirror being located downstream of an optical path of said first scanning mirror, said first spherical mirror having a distance to said first scanning mirror equal to a focal distance of said first spherical mirror, said first spherical mirror converging and reflecting said optical beam scattered by said first scanning mirror;
   a second spherical mirror, said second spherical mirror being located downstream of an optical path of said first spherical mirror, said second spherical mirror having a distance to said first spherical mirror equal to a sum of said focal distance of said first spherical mirror and a focal distance of said second spherical mirror, said second spherical mirror reflecting said optical beam reflected by said first spherical mirror;
   a second scanning mirror, said second scanning mirror being located downstream of an optical path of said second spherical mirror, said second scanning mirror having a distance to said second spherical mirror equal to a focal distance of said second spherical mirror, said second scanning mirror reflecting said optical beam converged by said second spherical mirror to process a vertical scanning (VS);
   a third spherical mirror, said third spherical mirror being located downstream of an optical path of said second scanning mirror, said third spherical mirror having a distance to said second scanning mirror equal to a focal distance of said third spherical mirror, said third spherical mirror converging and reflecting said optical beam scattered by said second scanning mirror; and
   a fourth spherical mirror, said fourth spherical mirror being located downstream of an optical path of said third spherical mirror, said fourth spherical mirror having a distance to said third spherical mirror equal to a sum of said focal distance of said third spherical mirror and a focal distance of said fourth spherical mirror, said fourth spherical mirror reflecting said optical beam reflected by said third spherical mirror,
   wherein a set of said first spherical mirror and said second spherical mirror together with a set of said third spherical mirror and said fourth spherical mirror compensate for astigmatism; and
   wherein a set of said first spherical mirror and said third spherical mirror together with a set of said second spherical mirror and said fourth spherical mirror compensate for coma.

2. The system according to claim 1,
   wherein said first scanning mirror is an HS mirror.

3. The system according to claim 1
   wherein said second scanning mirror is a VS mirror.

4. The system according to claim 1
   wherein each of said first scanning mirror and said second scanning mirror is a mirror turning in a way selected from a group consisting of a galvanometric way and a resonant way; and
   wherein said mirror is selected from a group consisting of a plane mirror and a polygon mirror.

5. The system according to claim 1
   wherein each of said first to the fourth spherical mirrors is coated with a film of a metal; and
   wherein said metal is selected from a group consisting of gold, silver and aluminum.

6. The system according to claim 1
   wherein said system further comprises a plurality of plane mirrors to fold optical paths into a size of 15×15×15 cubic centimeters.

7. The system according to claim 1,
   wherein a sagittal axle of said first spherical mirror and said third spherical mirror coincides with a tangential axle of said second spherical mirror and said fourth spherical mirror.

8. The system according to claim 1
   wherein said first spherical mirror and said third spherical mirror turn to X and −X direction while said second spherical mirror and said fourth spherical mirror turn to Y and −Y direction to compensate for coma.

9. The system according to claim 1,
   wherein said system has a wavefront irregularity root-mean-value smaller than $\frac{1}{14}$ wavelength of said optical beam.

10. The system according to claim 1,
    wherein said reflective optical scanning system has a light source having a wavelength ranged from ultra-violet light to a wavelength having tera-hertz.

* * * * *